(12) United States Patent
Taniyama et al.

(10) Patent No.: US 8,172,946 B2
(45) Date of Patent: May 8, 2012

(54) SEMICONDUCTOR DEVICE MANUFACTURING APPARATUS AND MANUFACTURING METHOD OF SEMICONDUCTOR DEVICE

(75) Inventors: Tomoshi Taniyama, Toyama (JP); Yoshikazu Takashima, Oyabe (JP); Mikio Ohno, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1210 days.

(21) Appl. No.: 11/885,551

(22) PCT Filed: Feb. 24, 2006

(86) PCT No.: PCT/JP2006/303381
§ 371 (c)(1),
(2), (4) Date: Nov. 14, 2007

(87) PCT Pub. No.: WO2006/093037
PCT Pub. Date: Sep. 8, 2006

(65) Prior Publication Data
US 2008/0166881 A1 Jul. 10, 2008

(30) Foreign Application Priority Data
Mar. 2, 2005 (JP) .................................. 2005-057980

(51) Int. Cl.
*C23C 16/00* (2006.01)
(52) U.S. Cl. .......... 118/715; 118/722; 438/758; 60/320; 123/568.12
(58) Field of Classification Search .................. 118/715, 118/722; 438/758
See application file for complete search history.

(56) References Cited

U.S. PATENT DOCUMENTS

| 4,377,394 A | * | 3/1983 | Muenger et al. | 48/62 R |
| 4,677,863 A | * | 7/1987 | Gay et al. | 73/863.12 |
| 4,940,213 A | * | 7/1990 | Ohmine et al. | 266/152 |

(Continued)

FOREIGN PATENT DOCUMENTS

JP A 06-295873 10/1994

(Continued)

OTHER PUBLICATIONS

Translation of Japanese Office Action issued in Japanese Patent Application No. 2007-505885 dated Jun. 3, 2010.

*Primary Examiner* — Ram Kackar
*Assistant Examiner* — Satish Chandra
(74) *Attorney, Agent, or Firm* — Oliff & Berridge, PLC

(57) ABSTRACT

Stagnation of gas used for substrate processing in an exhaust trap is prevented, and localized precipitation of components in the gas used for substrate processing is reduced. The proposed apparatus includes a substrate processing chamber (cylindrical space 250), a gas supply tube 232 for supplying substrate processing gas to the substrate processing chamber, a first exhaust tube (upstream exhaust tube 231*a*) for discharging gas used for substrate processing from the substrate processing chamber, an exhaust trap 49 for removing components contained in the gas used for substrate processing introduced through the first exhaust tube, and a second exhaust tube (downstream exhaust tube 231*b*) for exhausting gas out of said exhaust trap 49 after components have been removed from the gas used for substrate processing, wherein the exhaust trap 49 is provided with a cooled baffle plate 59 that is substantially perpendicular to the direction in which gas is introduced into the exhaust trap 49 and that has a concave surface 59*a* in the side facing the gas introduction port 55*a* of the exhaust trap 49.

10 Claims, 15 Drawing Sheets

U.S. PATENT DOCUMENTS

| | | | |
|---|---|---|---|
| 5,303,558 A * | 4/1994 | Caton et al. | 62/55.5 |
| 5,422,081 A | 6/1995 | Miyagi et al. | |
| 5,820,641 A | 10/1998 | Gu et al. | |
| 6,159,298 A | 12/2000 | Saito | |
| 2001/0003892 A1* | 6/2001 | Rikyuu et al. | 55/315.2 |
| 2003/0226366 A1 | 12/2003 | Tong et al. | |
| 2005/0000201 A1* | 1/2005 | Tanaka et al. | 55/482.1 |
| 2006/0174611 A1* | 8/2006 | Dilley et al. | 60/320 |
| 2006/0174833 A1* | 8/2006 | Yamazaki et al. | 118/719 |

FOREIGN PATENT DOCUMENTS

| | | |
|---|---|---|
| JP | A 09-202972 | 8/1997 |
| JP | A 09-225230 | 9/1997 |
| JP | A 11-195648 | 7/1999 |
| JP | A 2003-053101 | 2/2003 |
| JP | A 2003-224119 | 8/2003 |
| JP | A 2003-224120 | 8/2003 |
| JP | A 2004-305950 | 11/2004 |

* cited by examiner

BACKGROUND ART

BACKGROUND ART

BACKGROUND ART

BACKGROUND ART

SEMICONDUCTOR DEVICE MANUFACTURING APPARATUS AND MANUFACTURING METHOD OF SEMICONDUCTOR DEVICE

TECHNICAL FIELD

The present invention relates to a semiconductor device manufacturing apparatus and a manufacturing method of a semiconductor device for forming a silicon dioxide film, a silicon nitride film, an amorphous silicon thin film, or another such thin film on the surface of a substrate; and more specifically relates to a semiconductor device manufacturing apparatus and a manufacturing method of the semiconductor device wherein an exhaust trap is provided for recovering reaction by-products and the like from gas used for substrate processing.

BACKGROUND ART

FIG. 11 is an exploded view of a conventional semiconductor device manufacturing apparatus of this variety.

As shown in the diagram, a substrate processing chamber 3 of the semiconductor device manufacturing apparatus 1 is partitioned into ceilinged cylinders by a quartz reaction tube 4, and substrate processing gas is led into the substrate processing chamber 3 from a gas supply tube 13 connected to the bottom of the reaction tube 4. A gas exhaust tube 14 is also connected to the bottom of the reaction tube 4, allowing gas used for substrate processing and the like produced by the reaction in the substrate processing chamber 3 to be exhausted, and a vacuum pump 11 as a pressure-reducing exhaust apparatus is connected to the gas exhaust tube 14 via an exhaust tube 231. An exhaust trap 8 is provided to the exhaust tube 231 upstream of the vacuum pump 11, and this exhaust trap 8 is designed to remove residual components from the gas used for substrate processing exhausted from the reaction tube 4, i.e., from the substrate processing chamber 3. Positioned on both sides of the exhaust trap 8 are an upstream valve 9 on the upstream side and a downstream valve 10 on the downstream side, and these valves are provided to the exhaust tube 231 in order to attach and remove the exhaust trap 8. Furthermore, pipe heaters 16 are attached to the gas exhaust tube 14 and the exhaust tube 231 in order to prevent the precipitation of residual components, i.e., reaction by-products in the gas used for substrate processing exhausted through the reaction tube 4, and to supply the entire amount of gas to the exhaust trap 8. The pipe heaters 16 are composed of, e.g., ribbon heaters or other such flat heaters, and are wound around the exhaust tube 231 and the gas exhaust tube 14 so as to provide heating to the area between the exhaust trap 8 and the connection with the reaction tube 4.

The apparatus for installing and removing substrates (wafers) 23 in the reaction tube 4 is configured primarily from boats 12 for installing a plurality of substrates, and a boat elevator (not shown) for installing and removing the boats 12 in the reaction tube 4. The boat elevator is disposed vertically below the reaction tube 4, and the boats 12 are mounted on the boat elevator. A flange (not shown) as a lid for opening and closing the opening of the reaction tube 4 is provided at the bottom of the boats 12, and the flange includes an O ring (not shown) as sealing means for firmly bonding and sealing the flange to the peripheral edge of the opening of the reaction tube 4.

When a film is formed on the substrates 23 with the aid of the semiconductor device manufacturing apparatus 1, the boats 12 are mounted on the boat elevator, and the rising of the boat elevator causes a substrate 23 to be inserted into the reaction tube 4 at each boat 12. In this state, the temperature and pressure in the substrate processing chamber 3 are adjusted, and substrate processing gas is then supplied to the substrate processing chamber 3. The substrate processing gas undergoes a reaction due to the heat, and the film-forming components produced by the reaction accumulate on the surfaces of the substrates 23.

For example, in cases in which a gas mixture of $SiH_2Cl_2$ and $NH_3$ is supplied as a substrate processing gas to the substrate processing chamber 3, the reaction in the following equation (1) takes place in the substrate processing chamber 3, and $Si_3N_4$ (silicon nitride), which is a product of the reaction and which is a film-forming component, accumulates on the surfaces of the substrates 23.

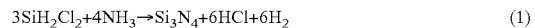

$$3SiH_2Cl_2 + 4NH_3 \rightarrow Si_3N_4 + 6HCl + 6H_2 \tag{1}$$

The HCl produced in this reaction bonds with $NH_3$ (ammonium) in a secondary reaction according to the following equation (2) to form $NH_4Cl$ (ammonium chloride), which is supplied together with the other reaction components as reaction products and the like from the gas exhaust tube 14 through the exhaust tube 231 to the exhaust trap 8. From the gas used for substrate processing, the exhaust trap 8 recovers the primary components produced by the reaction, the reaction by-products produced by a side reaction among the primary components, and un-reacted components (hereinbelow referred to as reaction by-products and the like) provided in excess of the reaction.

$$NH_3 + HCl \rightarrow NH_4Cl \tag{2}$$

When the exhaust trap 8 undergoes maintenance, the upstream valve 9 and the downstream valve 10 are fully closed, and the exhaust trap 8 is separated from the exhaust tube 231 and washed or subjected to some other maintenance.

The structure of the exhaust trap 8 is shown in FIGS. 12 through 15.

As shown in FIG. 12, a casing 8a of the exhaust trap 8 is configured from an outer tube 8b that is larger in diameter than the outside diameter of the exhaust tube 231, an inner tube 8c inserted in double-tube fashion into the outer tube 8b, and end plates 8d, 8e attached to both ends of the outer tube 8b and the inner tube 8c. A gas inlet tube 55, which passes through the outer tube 8b and inner tube 8c in the radial direction and which is communicated with the interior of the inner tube 8c, is joined to the casing 8a by welding, and a gas exhaust tube 56, which passes through the end plate 8e in the thickness direction and which is communicated with the interior of the inner tube 8c, is joined to the end plate 8e by welding.

In the outer tube 8b of the exhaust trap 8, in order to use the space between the outer tube 8b and the inner tube 8c as a cooling chamber (jacket chamber) 8f to cause reaction by-products and the like to precipitate on the inner surface of the inner tube 8c, a cooling water inlet tube 19 and a cooling water outlet tube 20 are connected to the outer tube 8b.

Furthermore, a trap main body 17 is housed within the inner tube 8c in order to remove reaction products and the like by means of a cooling surface, similar to the inner tube 8c. The trap main body 17 is attached to an end plate 17b, and the trap main body 17 has a structure that can be attached and removed from the inner tube 8c by attaching and removing the end plate 17b, as shown in FIG. 13.

The structure of the trap main body 17 is described next with reference to FIGS. 12, 13, and 14. The trap main body 17 is configured primarily from a spiral tube (cooling coil) 17a. The inlet $17a_1$ and outlet $17a_2$ of the spiral tube 17a pass through the end plate 17b in the thickness direction and are joined to the end plate 17b by welding.

The end plate 17b constitutes a tapered flange that can be attached and removed from a tapered flange 18a at one end of the exhaust trap 8 by means of a coupling (JIS). A spiral shape has a greater surface area than a linear tube and more opportunities to come into contact with reaction by-products and the like, and therefore has the advantage of enabling recovery of more reaction by-products and the like by cooling-induced precipitation.

However, the trap main body 17 is inserted into the inner tube 8c of the exhaust trap 8, cooling water from a cooling water circulation apparatus is passed from the inlet $17a_1$ of the spiral tube 17a to the outlet $17a_2$, and reaction by-products and the like in the semiconductor device manufacturing apparatus 1 are actually recovered, whereupon reaction by-products and the like sometimes accumulate primarily in the gas inlet vicinity X of the gas inlet tube 55 of the exhaust trap 8 and in the end plate 8d side Y of the spiral tube 17a, as shown in FIG. 12, and blockage sometimes occurs upstream of the exhaust trap 8.

In view of this, the flow of gas used for substrate processing within the exhaust trap 8 has been simulated, and the cause has been analyzed. The results are shown in FIG. 15. In FIG. 15, the directions of the arrows indicate the flow of gas, and the lengths of the arrows indicate speed. Longer arrows indicate a higher flow rate of gas used for substrate processing, and shorter arrows indicate a lower flow rate.

<Results of Simulation>

(1) When the gas used for substrate processing is introduced into the exhaust trap 8 from the gas inlet tube 55, the flow of gas used for substrate processing changes direction first at one end plate 8d in the vicinity of the connection with the inner tube 8c of the casing 8a, then changes direction towards the opposite side of the entrance of the spiral tube 17a, and then changes direction again in the vicinity of the connection with the gas exhaust tube 56 to be exhausted out to an exhaust tube (hereinafter referred to as the downstream exhaust tube) 231b on the downstream side.

(2) The speed of the gas used for substrate processing is low in the vicinity of the connection between the gas inlet tube 55 and the inner tube 8c, and at the entrance of the spiral tube 17a, and the flow stagnates.

These simulation results (1) and (2) lead to speculation that (a) once precipitated, the reaction by-products and the like more easily precipitate on the precipitation surface, and (b) when the time of contact with the cooling surface (retention time) increases, the amount of precipitated reaction by-products and the like increases proportionately. Conversely, when the contact time decreases, the amount of precipitated reaction by-products and the like also decreases. From these speculations, it is assumed that in a conventional exhaust trap 8, the flow rate is fairly low and the contact time (retention time) is long in the vicinity of connection between gas inlet tube 55 and inner tube 8c of the exhaust trap 8 and at the entrance of the spiral tube 17a. Therefore, reaction by-products and the like in the gas used for substrate processing are precipitated mostly in these two locations, and the reaction by-products and the like cannot be substantially trapped at the downstream side of the spiral tube 17a even in the presence of a capacity to recover the reaction by-products and the like.

In a known example of technology related to this type of exhaust trap, a cartridge is configured from a water cooling tube and a trapping member (Patent Document 1).
Patent Document 1: JP-A 9-202972

DISCLOSURE OF THE INVENTION

Problems which the Invention is Intended to Solve

Thus, the conventional exhaust trap functions well to trap reaction by-products and the like, but problems are encountered in that flow stagnation causes the reaction by-products and the like to form blockages.

In view of this, technological problems that need to be resolved arise in terms of making it difficult for blockages to occur and enabling reaction by-products and the like to be trapped throughout the entire exhaust trap, and an object of the present invention is to resolve these problems.

Means for Solving these Problems

A first aspect provides a semiconductor device manufacturing apparatus including a substrate processing chamber, a gas supply tube for supplying substrate processing gas to the substrate processing chamber, a first exhaust tube for discharging gas used for substrate processing from the substrate processing chamber, an exhaust trap for removing components contained in the gas used for substrate processing introduced through the first exhaust tube, and a second exhaust tube for exhausting gas out of the exhaust trap after components have been removed from the gas used for substrate processing; wherein the exhaust trap is provided with a cooled baffle plate that is substantially perpendicular to the direction in which gas is introduced into the exhaust trap and that has a concave surface in the side facing the gas introduction port of the exhaust trap.

The term "gas used for substrate processing" refers to gas resulting from substrate processing, and to gas discharged from the substrate processing chamber through the first exhaust tube into the exhaust trap.

The term "components contained in the gas used for substrate processing" refers to primary components (primary products) produced by the reaction during substrate processing, reaction by-products (secondary products) produced by a secondary reaction, and excess un-reacted components that could not directly contribute to the reaction.

The term "substantially perpendicular" refers to near-perpendicular angles that include a perpendicular angle.

Furthermore, the aspect of interposing an exhaust trap between the exhaust tubes is also included in the phrase "a first exhaust tube for discharging gas used for substrate processing, an exhaust trap for removing components contained in the gas used for substrate processing introduced through the first exhaust tube, and a second exhaust tube for exhausting gas out of the exhaust trap after components have been removed from the gas used for substrate processing."

Furthermore, the phrase "a cooled baffle plate that has a concave surface in the side facing the gas introduction port of the exhaust trap" refers to a plate-shaped member wherein the bottom of the concave surface faces the gas introduction port, and reaction by-products and the like can be recovered on the concave surface. Therefore, the baffle plate may be one obtained by forming a single plate in a curve, by forming a concave surface by machining the surface of a thick plate, or by fixing a curved plate to a flat plate to form an integrated plate-shaped member.

The gas used for substrate processing introduced into the exhaust trap from the first exhaust tube (upstream exhaust tube) has high energy at high temperatures, and a member for slowing the flow rate is not placed before the baffle plate. Therefore, reaction by-products and the like in the gas used for substrate processing do not adhere to the gas introduction port of the exhaust trap. The baffle plate is substantially perpendicular to the flow direction in the exhaust trap, and is located in front of the direction in which the gas used for substrate processing flows. The baffle plate is cooled, and the concave surface of the baffle plate is recessed towards the opposite side of the gas introduction port, resulting in the accumulation of reaction by-products and the like contained in the gas used for substrate processing. Therefore, coming into contact with this cooled concave surface causes the reaction by-products and the like to cool and to precipitate and accumulate on the concave surface. Also, since the concave surface is recessed to increase the distance between the concave surface and the gas introduction port, the amount of reaction by-products and the like adhering to the gas introduction port after being reflected by the concave surface is greatly reduced. The concave surface acts as a tray, and reaction by-products and the like in the form of gel or tar are retained in the concave surface; therefore, reaction by-products in the form of gel or tar can be inhibited from flowing out into devices downstream of the exhaust trap.

A second aspect provides a semiconductor device manufacturing apparatus including a substrate processing chamber, a gas supply tube for supplying substrate processing gas to the substrate processing chamber, a first exhaust tube for exhausting out gas used for substrate processing from the substrate processing chamber, an exhaust trap in which the gas used for substrate processing is introduced through a gas introduction port connected to the first exhaust tube, and components contained in the gas used for substrate processing are removed; and a second exhaust tube for exhausting gas out of the exhaust trap after components have been removed from the gas used for substrate processing; wherein the exhaust trap has a baffle plate that is substantially perpendicular to the direction in which gas is introduced into the exhaust trap, and a cooling tube that is provided between the gas introduction port and the baffle plate and is disposed near the baffle plate in the space between the gas introduction port and the baffle plate.

In cases in which the baffle plate and the cooling tube are formed integrally, manufacturing costs increase because the baffle plate must be thicker and a cooling water channel must be formed in the baffle plate, but forming the baffle plate and the cooling tube separately in this manner allows for easier manufacturing, and costs can be reduced. Since the cooling tube is disposed in the space between the gas introduction port and the baffle plate, reaction by-products and the like adhere effectively to the baffle plate, and the in cases in which a cartridge, for example, is formed by the baffle plate and the cooling tube, the cartridge can be removed and washed, and ease of maintenance is therefore improved. The cooling tube cools the surrounding space to form a cooled atmosphere, and since the high-temperature gas used for substrate processing reaches the baffle plate after cutting across the cooled atmosphere and being cooled, most of the reaction by-products and the like contained in the gas used for substrate processing are precipitated on the baffle plate.

Furthermore, a third aspect is the first aspect in which a flow adjustment plate is provided so that the gas used for substrate processing introduced into the exhaust trap flows in the direction of the baffle plate. Thus, all of the gas used for substrate processing introduced into the exhaust trap can be made to flow to the baffle plate, and the cooled baffle plate can therefore be effectively used to trap components contained in the gas used for substrate processing.

A fourth aspect is the first aspect in which a gas circulation port is provided to the baffle plate.

When a gas circulation port is thus provided to the baffle plate, the gas used for substrate processing flows more easily, and the reaction by-products and the like adhere more easily to the baffle plate. The reaction by-products and the like adhere most easily in the vicinity of the gas circulation port because the flow rate of gas used for substrate processing is slowed at the baffle plate and the gas used for substrate processing accumulates at the gas circulation port. Since the reaction by-products have the property of adhering more easily to reaction by-products that have already adhered, the result is effective adhesion on the peripheral edges of the gas circulation port. Also, in cases in which reaction by-products and the like block off the gas circulation port, the reaction by-products and the like are trapped on the baffle plate and on the reaction by-products that are blocking off the gas circulation port. Cleaned gas is exhausted out to the second exhaust tube using a space other than the gas circulation port as an exhaust channel.

A fifth aspect is the second aspect in which a flow adjusting plate is provided so that the gas used for substrate processing introduced into the exhaust trap flows in the direction of the baffle plate.

Thus, the efficiency with which the reaction by-products and the like are trapped by the concavity is improved because the gas used for substrate processing introduced into the exhaust trap reliably comes into contact with the cooled baffle plate.

A sixth aspect is the second aspect in which a gas circulation port is provided to the baffle plate.

When a gas circulation port is thus provided to the baffle plate, the gas used for substrate processing flows more easily, and the reaction by-products and the like adhere more easily to the baffle plate. The reaction by-products and the like adhere most easily in the vicinity of the gas circulation port because the flow rate of gas used for substrate processing is slowed at the baffle plate and the gas used for substrate processing accumulates at the gas circulation port. Since the reaction by-products have the property of adhering more easily to reaction by-products that have already adhered, the result is effective adhesion on the peripheral edges of the gas circulation port. Also, in cases in which reaction by-products and the like block off the gas circulation port, the reaction by-products and the like are trapped on the baffle plate and on the reaction by-products that are blocking off the gas circulation port. Cleaned gas is exhausted out to the second exhaust tube using a space other than the gas circulation port as an exhaust channel.

A seventh aspect is the first aspect in which the concave surface is formed in a curve.

When the concave surface is curved, the efficiency of trapping reaction products and the like is improved because the gas used for substrate processing flows easily along the concave surface. The amount of gas used for substrate processing reflected back to the gas introduction port is reduced overall, because the distance from the concave surface to the gas introduction port is the same at all points.

An eighth aspect is the second aspect wherein the gas circulation port is provided in the concave surface of the baffle plate. When the gas circulation port is provided to the baffle plate, a flow of gas used for substrate processing towards the gas circulation port is created in the trap main body because the gas used for substrate processing passes through the gas circulation port. Therefore, reaction products and the like in the gas used for substrate processing are trapped by the peripheral edges of the gas circulation port and by the baffle plate, similar to the fourth aspect.

A ninth aspect is the third aspect, wherein a plurality of flow adjusting plates is provided to the concave surface. When flow adjusting plates are provided to the concave surface, the flow adjusting plates guide the gas used for substrate processing to the baffle plate, and the efficiency for trapping reaction products and the like is improved.

A tenth aspect is the first aspect in which the exhaust trap is formed from at least a casing main body and a trap main body whose primary component is the baffle plate, and the trap main body can be attached and removed from the casing main body.

With this configuration, the trap main body is easily attached and removed, and the ease of maintenance of the trap main body is improved.

An eleventh aspect is the second aspect in which the exhaust trap is formed from at least a casing main body and a trap main body whose primary components are the baffle plate and the cooling tube, and the trap main body can be attached and removed from the casing main body. With this configuration, the trap main body is easily attached and removed, and the ease of maintenance of the trap main body is improved.

A twelfth aspect is the tenth aspect in which the casing main body is provided so as to have a higher temperature than the baffle plate. Since the baffle plate is cooled and the casing main body is not cooled but is warmed by the heat transfer from the gas used for substrate processing, the casing main body has a higher temperature than the baffle plate, and reaction products do not adhere to the casing main body or the gas introduction port but are trapped on the cooled baffle plate.

A thirteenth aspect is the first or second aspect in which a partitioning wall is formed at one end surface of the baffle plate in the longitudinal direction so as to block the flow of gas used for substrate processing into the second exhaust tube. Thus, since a partitioning wall blocks the flow of gas used for substrate processing into the second exhaust tube, un-processed substrate processing gas is not directly exhausted out through the second exhaust tube.

A fourteenth aspect is the second aspect in which the exhaust trap is formed from at least a casing main body, a trap main body whose primary components are the baffle plate and the cooling tube, and an end plate for supporting the trap main body by supporting the cooling tube; and in the trap main body, a partitioning wall is formed at one end surface of the baffle plate in the longitudinal direction so as to form a flow channel with the end plate. Thus, gas used for substrate processing can be flowed to the back surface of the baffle plate, and the back surface of the baffle plate can be used as a trapping surface for reaction products and the like contained in the gas used for substrate processing.

A fifteenth aspect is the third aspect in which at least part of the flow adjusting plate is formed into a ring shape, and the cooled area is formed on the inner side of the ring-shaped portion of the flow adjusting plate. The gas used for substrate processing is cooled by cutting across the cooling area on the inner side of the flow adjusting plate, and is further cooled by the cooled baffle plate, and the capacity of the baffle plate to trap reaction products and the like is therefore improved substantially.

A sixteenth aspect is the second aspect in which a flow adjusting plate is provided so that the gas used for substrate processing introduced into the exhaust trap flows in the direction of the baffle plate, at least part of the flow adjusting plate is formed into a ring shape, and the cooling pipe is provided on the inner side of the ring-shaped portion of the flow adjusting plate. Thus, since the gas used for substrate processing enters the cooled atmosphere and comes into contact with the baffle plate after cutting across the cooled area, reaction products and the like in the gas used for substrate processing are precipitated on the concave surface of the baffle plate.

A seventeenth aspect provides a manufacturing method of the semiconductor device for performing processing by using the semiconductor device manufacturing apparatus of the first aspect, comprising:

processing a substrate stored within said substrate processing chamber by exhausting said gas used for substrate processing out of said substrate processing chamber while supplying said substrate processing gas to said substrate processing chamber; and removing components contained in said gas used for substrate processing by introducing said gas used for substrate processing into an exhaust trap to pass through this exhaust trap, the components being removed by bringing said gas used for substrate processing into contact with a cooled baffle plate that is substantially perpendicular to a direction of a gas introduction to said exhaust trap and that has a concave surface on the introduction port side of said exhaust trap.

Thus, reaction by-products and the like in the gas used for substrate processing are precipitated on the concave surface, similar to the first aspect. Since the capacity to trap reaction by-products and the like increases proportionate to the capacity of the concave surface, the maintenance cycle is longer and the productivity of the semiconductor device manufacturing apparatus is improved.

An eighteenth aspect provides a manufacturing method of a semiconductor device, comprising:

processing a substrate stored within a substrate processing chamber by exhausting gas used for substrate processing out of said substrate processing chamber while supplying substrate processing gas to said substrate processing chamber; and removing components contained in said gas used for substrate processing by introducing said gas used for substrate processing into an exhaust trap to pass through this exhaust trap, the components being removed by bringing said gas used for substrate processing into contact with a cooled baffle plate that is substantially perpendicular to a direction of a gas introduction to said exhaust trap and that has a concave surface on the introduction port side of said exhaust trap. Thus, reaction by-products and the like in the gas used for substrate processing are precipitated on the concave surface, similar to the first aspect. Since the capacity to trap reaction by-products and the like increases proportionate to the capacity of the concave surface, the maintenance cycle is longer.

Effects of the Invention

To summarize the above, the present invention exhibits the following superior effects.

Stagnation in the exhaust trap can be prevented, and reaction by-products can be recovered over at least the entire concave surface of the cooled baffle plate. Localized clogging in the exhaust trap can also be prevented. Therefore, the maintenance cycle of the exhaust trap is longer, which can contribute to improving the operating efficiency of the semiconductor device manufacturing apparatus and the productivity of the semiconductor device. The flow of gas used for substrate processing in the exhaust trap is satisfactory, and the efficiency of trapping reaction by-products is greatly improved because reaction by-products are precipitated over the entire baffle plate. Furthermore, reaction by-products and the like are retained on the concave surface and can therefore be prevented from flowing downstream.

BEST MODE FOR CARRYING OUT THE INVENTION

The preferred embodiments of the present invention are described hereinbelow with reference to the accompanying diagrams. In the following embodiments, $SiH_2Cl_2$ and $NH_3$ are used as the gas used for substrate processing and a $Si_3N_4$ film is formed by CVD treatment on the surface of a silicon substrate (hereinafter referred to as a wafer), and the present invention is applied to various processing apparatuses and methods for removing reaction by-products and the like by bringing the gas used for substrate processing resulting from the aforementioned processes into contact with the cooling surface and precipitating the reaction by-products and the like. Components identical to the conventional technology are denoted by the same numerical symbols and are not described in detail.

In the present embodiment, the numerical quantities, materials, ingredients, and shapes are merely examples as long as these are not specific to the present invention.

Embodiment 1

First, a low-pressure CVD reactor will be described with reference to FIG. 1 as an example of a semiconductor device manufacturing apparatus according to the present invention.

FIG. 1 is a longitudinal cross-sectional view of a low-pressure CVD reactor (hereinbelow referred to as a reactor). An outer tube 205 of the reactor 200 is configured from, e.g., quartz ($SiO_2$) or another such heat-resistant material, is closed off at the top end, and is formed into a cylindrical shape having an opening that opens at the bottom end. The inner tube 204 is formed into a cylindrical shape having openings at both the top and bottom ends, and is disposed concentrically inside the outer tube 205. The outer tube 205 and the inner tube 204 partition off a cylindrical space 250 between each other. Gas that rises from the top opening in the inner tube 204 passes through the cylindrical space 250 and is exhausted out through the exhaust tube 231.

A manifold 209 made of, e.g., stainless steel or the like is engaged with the lower ends of the outer tube 205 and the inner tube 204, and the outer tube 205 and inner tube 204 are held on this manifold 209. The manifold 209 is fastened to holding means (hereinafter referred to as a heater base) 251. Annular flanges are provided at the bottom end of the outer tube 205 and the top open end of the manifold 209, and an O ring 220 as an airtight member (sealing member) is disposed between the flanges to hermetically seal the flanges together.

A disc-shaped lid (hereinafter referred to as a sealing cap) 219 made of, e.g., stainless steel or the like is attached to the bottom end opening of the manifold 209, and this lid can be attached and removed in a hermetically sealable manner via the O ring 220. Gas supply tubes 232 are provided so as to pass through the sealing cap 219. Substrate processing gas for processing is supplied into the outer tube 205 by these gas supply tubes 232. These gas supply tubes 232 are connected to flow rate control means (hereinafter, a mass flow controller (hereinafter referred to as MFC 241)). The MFC 241 is connected to a gas flow rate controller and is capable of controlling the flow rate of supplied gas in specific amounts.

A pressure adjuster (e.g., an APC or an $N_2$ ballast controller (hereinafter it is assumed that an APC is used)) 242 and an exhaust tube 231 linked to a low-pressure exhaust apparatus (hereinafter referred to as a vacuum pump) 246 are connected to the top of the manifold 209. Since a low-pressure atmosphere of a specific pressure is achieved by exhausting out the gas flowing through the cylindrical space 250 between the outer tube 205 and the inner tube 204 and controlling the pressure in the outer tube 205 by means of the APC 242, the pressure in the cylindrical space 250 is detected by pressure detection means (hereinafter referred to as a pressure sensor) 245 and is controlled by the pressure controller.

Rotation means (hereinafter referred to as a rotating shaft) 254 is linked to the sealing cap 219, and the rotating shaft 254 rotates the substrate holding means (hereinafter referred to as boats) 217 and the substrates (hereinafter referred to as wafers) W held on the boats 217. The sealing cap 219 is also linked to elevating/lowering means (hereinafter referred to as a boat elevator) 115 to elevate and lower the boats 217. A drive controller is provided to control the rotating shaft 254 and boat elevator 115 at a specific speed.

Heating means (hereinafter referred to as a heater) 207 is formed concentrically around the external periphery of the outer tube 205. The heater 207 uses temperature detection means (hereinafter a thermocouple) 263 to detect the temperature in order to bring the temperature inside the outer tube 205 to a specific processing temperature, and the heater is controlled by a temperature controller (not shown).

As shown in FIG. 1, to describe an example of a low-pressure CVD treatment method using the reactor 200, first, the boat elevator 115 lowers the boats 217. A plurality of wafers W is held on the boats 217. Next, the heat of the heater 207 increases the temperature in the outer tube 205 to a specific treatment temperature. The MFC 241 connected to the gas supply tubes 232 fills the outer tube 205 in advance with inert gas, the boat elevator 115 elevates the boats 217 and inserts the boats 217 into the outer tube 205, and the internal temperature of the outer tube 205 is maintained at a specific treatment temperature. After the interior of the outer tube 205 is exhausted to a specific degree of vacuum, the boats 217 and the wafers W held on the boats 217 are rotated by means of the rotating shaft 254. At the same time, substrate processing gas is supplied from the gas supply tubes 232. The supplied substrate processing gas moves upward the interior of the outer tube 205, and is supplied uniformly to the wafers W.

The interior of the outer tube 205 during low-pressure CVD treatment is exhausted via the exhaust tube 231, and the pressure is controlled by the APC 242 so that a specific vacuum is achieved. This low-pressure CVD treatment is performed for a specific amount of time. The exhaust tube 231 is divided into an upstream exhaust tube 231a and a downstream exhaust tube 231b, which are connected via an exhaust trap 49, described later.

Thus, when the low-pressure CVD treatment ends, in preparation for low-pressure CVD treatment of the next wafer W, the gas used for substrate processing in the outer tube 205 is replaced with inert gas, the pressure is returned to normal, and then the boat elevator 115 lowers the boat 217, and the boat 217 and processed wafer W are extracted from the outer tube 205. The processed wafer W on the boat 217 extracted from the outer tube 205 is exchanged with an un-processed wafer W, and then the interior of the outer tube 205 is again elevated in the same manner as before, and low-pressure CVD treatment is performed.

Below are examples of the film-forming conditions in cases in which a film is formed on the surface of a wafer having a diameter of 200 mm in the reactor 200 of the present embodiment.

(1) Formation of an $Si_3N_4$ Film
Wafer temperature: 600 to 800° C.
Gas Types and Supplied Amounts:
$SiH_2Cl_2$ flow rate: 0.05 to 0.2 L/min
$NH_3$ flow rate: 0.5 to 2 L/min
Treatment pressure: 30 to 500 Pa
Precipitate: $NH_4Cl$ (ammonium chloride)
(2) Formation of an $Si(O_2CH)_4$ Film (Tetraethyl Orthosilicate; TEOS)
Wafer temperature: 600 to 750° C.;
Gas Types and Supplied Amounts:
$O_2$ flow rate: 0.001 to 0.01 L/min;
TEOS flow rate: 0.01 to 0.5 L/min
Treatment pressure: 50 to 200 Pa Next, the exhaust trap 49 according to the semiconductor device manufacturing apparatus of the present invention will be described with reference to FIGS. 2 through 6. This exhaust trap 49 is located between the upstream exhaust tube 231a (first exhaust tube) and the downstream exhaust tube 231b (second exhaust tube), as was described using FIG. 11.

FIG. 2 is a perspective view of the exhaust trap 49, wherein the numerical symbol 50 denotes a casing. A casing main body 52 of the exhaust trap 49 is formed into a cylinder, and an end plate 53 is attached by means of a plurality of pawl clamps 62 at one end in the axial direction of the casing main body 52, as shown in FIG. 2. A gas exhaust tube 56 is attached at the other end of the casing main body 52 in order to exhaust out gas through an end plate 54 after the gas used for substrate processing and the like has been cleaned, and a gas inlet tube 55 is attached in the substantial center of the periphery of the casing main body 52 in order to introduce the gas used for substrate processing and the like. A tapered flange 15 is joined to the upstream end of the gas inlet tube 55 in order to form a connection with the upstream exhaust tube (first exhaust tube) 231a, and a tapered flange 15 is joined to the downstream end of the gas exhaust tube 56 in order to form a connection with the downstream exhaust tube (second exhaust tube) 231b. A handle 63 is provided to one of the end plates 53 to make handling easier.

FIG. 3 is a cross-sectional perspective view along the axial direction of the exhaust trap 49, and this diagram shows the manner in which a trap main body 57 is accommodated within the casing main body 52. As shown in FIG. 3, the trap main body 57 extends from one end in the casing main body 52 to the other end, and traps reaction by-products and the like by blocking off the gas used for substrate processing being introduced through a gas introduction port 55a of the gas inlet tube 55. The cooling chamber described in the prior art section is removed from the casing main body 52.

FIG. 4 is a cross-sectional view along the axial direction of the exhaust trap 49, and FIG. 5 is a perspective view showing an external view of the trap main body 57. The cross section of the trap main body 57 shown in FIG. 4 is displaced by 90° in the circumferential direction from the cross section of the trap main body 57 shown in FIG. 3.

As shown in FIGS. 4 and 5, the trap main body 57 is primarily configured from a cooling tube 58 supported on one end plate 53, a baffle plate 59 supported on the cooling tube 58, and a plurality of flow adjustment plates 60, wherein the cooling tube 58 is supported on the end plate 53 by welding, and the baffle plate 59 is supported on the cooling tube 58 by a bracket 61.

FIG. 6 is a cross-sectional view of the trap main body 57 in the axial direction.

As shown in FIGS. 5 and 6, the cooling tube 58 is configured from two pipe members 58a, 58a aligned with one of the end plates 53; an even number of pipe members 58b, 58b, etc. disposed on the insides of the pipe members 58a, 58a and at lower positions at specific heights; and a plurality of coupling tubes 58c, 58c, etc. that link the distal ends and back ends of the pipe members 58b, 58b, etc. together in the transverse direction of the baffle plate 59 and that form a series of cooling tubes 58 that double back multiple times.

A set of two coupling tubes 58c, 58d are used for the coupling tubes 58c, 58c, etc. as shown in FIGS. 3, 5, and 6, but L-shaped tubes may also be used.

One of the two pipe members 58a, 58a on the outer side of the cooling tube 58 acts as a cooling water inlet tube, the other acts as a cooling water outlet tube, and both are connected to a chiller unit or another such cooling medium circulation apparatus.

The baffle plate 59 is formed into an arcuate shape centered around the axis of the cooling tube 58 so as to form a concave surface 59a that faces the gas introduction port 55a, as shown in FIGS. 3 and 6; and flanges 65, 65 extending in the axial direction are connected to the sides of the baffle plate as shown in FIG. 6.

The baffle plate 59 and the flanges 65, 65 are attached to the pipe members 58a, 58b and extend from one end thereof to the other, as shown in FIGS. 5 and 6; and the flanges 65, 65 of the baffle plate 59 are in linear contact with the two outer pipe members 58a, 58a while the inner pipe members 58b, 58b are disposed in proximity to the concave surface 59a of the baffle plate 59, as shown in FIG. 6. The baffle plate 59 is fastened to the two outer pipe members 58a, 58a so as to be centered around the pipe members 58a and located on the side opposite the gas inlet tube 55 in relation to the casing main body 52, and so that the concave surface 59a is substantially perpendicular to the flow of the gas used for substrate processing introduced in the radial direction from the gas inlet tube 55.

The flow adjustment plates 60, etc. are formed into C ring shapes, parts of which in the circumferential direction are recessed in the radial direction, and are fastened by welding in a state in which both sides of the recessed parts are engaged with the concave surface 59a of the baffle plate 59 along the circumferential direction. These flow adjustment plates 60, etc. are disposed at specific intervals in the longitudinal direction of the baffle plate 59 as shown in FIGS. 3, 4, and 5, so that the speed of the gas used for substrate processing flowing between the flow adjustment plates 60, 60 can be reduced to a specific speed.

Furthermore, as shown in FIG. 4, semicircular partitioning walls 67, 68 are formed integrally on both end surfaces of longitudinal direction of the baffle plate 59 so that these end surfaces are the bottom sides of the walls, and a flow channel 72 is formed between one partitioning wall 67 and one end plate 53. To prevent gas from blowing through the gas outlet 55c into the gas exhaust tube 56, a partitioning wall 69 is connected to the other partitioning wall 68 so as to cover the top half of the gas exhaust tube 56.

Furthermore, removing the bottom half of the part of the gas exhaust tube 56 that passes through the casing main body 52 provides a flow channel 70 that is communicated with the gas exhaust tube 56.

Next, the action of the exhaust trap 49 will be described.

The gas used for substrate processing produced from low-pressure CVD treatment contains un-reacted components that were not involved in the reaction, primary products produced by the reaction, and reaction by-products and the like from a secondary reaction (side reaction) between the primary products.

In cases in which a film of, e.g., silicon nitride is formed and a gas mixture of dichlorosilane ($SiH_2Cl_2$) and ammonium ($NH_3$) is used as the reaction gas, heating causes the following reaction, and silicon nitride accumulates on the surface of the wafer W.

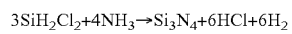

Hydrogen chloride is produced at the same time as the silicon nitride, and the hydrogen chloride binds with the ammonia in the following side reaction to produce ammonium chloride ($NH_4Cl$) as a reaction by-product.

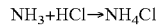

The vacuum pump 11 exhausts out the interior of the outer tube 205 through the downstream exhaust tube 231b, and the gas used for substrate processing containing ammonium chloride and other such reaction by-products and the like is discharged into the upstream exhaust tube 231a. The side that is upstream of the exhaust trap 8 is heated by the pipe heaters 16 (see FIG. 11) and is kept at a specific temperature as previously described, and cooling therefore does not cause ammonium chloride to adhere. The high-temperature gas used for substrate processing that contains these reaction by-products and the like passes through the upstream exhaust tube 231a and is introduced into the casing main body 52 through the gas inlet tube 55 of the exhaust trap 49.

In FIG. 4, the gas used for substrate processing introduced into the casing main body 52 through the gas introduction port 55a of the gas inlet tube 55 approaches the baffle plate 59 along a flow channel 71 between the adjacent flow adjustment plates 60, 60. In this case, the gas used for substrate processing has high kinetic energy at high temperatures and moves in toward the flow adjustment plates 60, the cooling tube 58, and the baffle plate 59. As previously described, the gas inlet tube 55 and the casing main body 52 do not have a cooling structure as in conventional practice, the gas used for substrate processing flows faster therein, and reaction by-products and the like therefore do not cause the gas inlet tube 55 and gas introduction port 55a to be closed off. In the casing main body 52, the gas used for substrate processing is slowed by the flow adjustment of the adjacent flow adjustment plates 60, 60 while approaching the cooling area (cooling atmosphere) surrounding the baffle plate 59 and the cooling tube 58. The cooling area is formed by the cooling of the baffle plate 59 and the cooling tube 58. In this case, the space between the flow adjustment plates 60, 60 and the temperature of the cooling area are established at a degree at which reaction by-products and the like are precipitated when the gas used for substrate processing comes into contact with the cooling tube 58 or the concave surface 59a of the baffle plate 59. When the cooling area is formed on the insides of the ring-shaped flow adjustment plates 60, the distal ends of the flow adjustment plates 60 are constantly in contact with the gas used for substrate processing, and the entrance of the flow channel 71 between the flow adjustment plates 60, 60 is therefore prevented from being blocked off. Therefore, reaction by-products and the like are not precipitated on the distal ends of the flow adjustment plates 60, but are rather precipitated near the concave surface 59a of the baffle plate 59. After passing between the flow adjustment plates 60, 60, the gas used for substrate processing collides with the concave surface 59a of the baffle plate 59. Some of the gas is reflected back to the gas introduction port 55a, but the amount of gas used for substrate processing reflected to the gas introduction port 55a is greatly reduced because the concave surface 59a faces the gas introduction port 55a, the distance to the gas introduction port 55a is increased proportionate to the depth of the concave surface 59a, and the flow rate of gas used for substrate processing is slowed by the flow adjustment of the flow adjustment plates 60. Therefore, virtually no reaction by-products are precipitated in the gas introduction port 55a.

When the gas used for substrate processing spreads in the transverse direction and longitudinal direction of the baffle plate 59 along the concave surface 59a of the baffle plate 59, the reaction by-products and the like are precipitated on the surface of the cooling tube 58 and on the entire concave surface 59a. In this case, since the depth, width, and length (i.e., the volume) of the concave surface 59a is determined in advance based on the amount of gas used for substrate processing that is processed until a specific maintenance cycle, the maintenance cycle can be made longer than in conventional practice. In other words, a greater amount of reaction by-products and the like is recovered. In cases in which reaction by-products and the like grow from the side of the baffle plate 59, temporally causing the flow channel 71 of the flow adjustment plates 60, 60 to be closed off, the gas used for substrate processing cuts across the interior of the casing main body 52 along the flow channel 72 between the casing main body 52 and the partitioning wall 67 on one side shown in FIG. 4, passes along the flow channel 70 between the back surface of the baffle plate 59 and the inner surface of the casing main body 52, and escapes through the gas exhaust tube 56. In this type of process, one partitioning wall 67 and the reverse side of the baffle plate 59 constitute a cooling surface where reaction by-products and the like are precipitated. Therefore, the function of the exhaust trap 49 for trapping reaction by-products and the like is retained. Also, reaction by-products and the like are not precipitated on the inner surfaces of the casing main body 52 because the casing main body 52 is not cooled but is warmed by the heat transfer from the gas used for substrate processing. Therefore, the exhaust trap 49 can still reliably trap reaction by-products and the like even in cases in which the growth of reaction by-products and the like closes of the flow channel 71.

Thus, the exhaust trap 49 according to the present embodiment overcomes blockage of reaction by-products and the like, and the amount of reaction by-products and the like recovered can be markedly improved. The maintenance cycle is therefore longer than in conventional practice. Also, since the labor and cost of maintenance are reduced, and the exhaust trap 49 substantially completely removes ammonium chloride in the gas used for substrate processing, the side that is downstream of the exhaust trap 49 requires maintenance much less frequently.

When a specific maintenance cycle is reached, maintenance is performed on the exhaust trap 49. In this case, first, the upstream valve 9 and the downstream valve 10 are fully closed, the side of the vacuum pump 246 that suctions out the outer tube 205 is separated from the exhaust system (see FIG. 1), and the pawl clamps 62 are removed to separate the exhaust trap 49 from the upstream exhaust tube 231a and the downstream exhaust tube 231b. The trap main body 57 is extracted from the exhaust trap 49, and is subjected to cleaning, washing, upgrading, and other such maintenance. In this case, washing and other such cleaning is simplified because the trap main body 57 is a cartridge that can be removed from the casing main body 52 and is configured primarily from the cooling tube 58, which is also shaped as a straight tube, and the curved baffle plate 59. As previously described, since the reaction by-products and the like are trapped by the easily removed trap main body 57 and not by the inner surfaces of the casing main body 52 as in conventional practice, ease of maintenance is greatly improved during washing or cleaning. Since the conventional double-tube structure is dispensed with, the trap can be easily manufactured and maintained.

In order to maintain the productivity of the semiconductor device manufacturing apparatus, other exhaust traps 49 can of course be substituted and varied in cases in which the apparatus, type of gas, or other factors are varied, or in cases in which the cooling tubes or other such components of the exhaust trap 49 itself require maintenance.

Embodiment 2

Another embodiment of the exhaust trap according to the present invention is shown in FIGS. 7 through 9. Components identical to those described in Embodiment 1 are denoted by the same numerical symbols and are not described in detail.

The characteristic of the present embodiment is that the baffle plate 59 of Embodiment 1 has slits formed as gas circulation ports for circulating the gas used for substrate processing.

FIG. 7 is a cross-sectional view of the exhaust trap 49 in the axial direction, FIG. 8 is a perspective view of the trap main body 57 as seen from the side opposite the gas inlet tube 55, and FIG. 9 is a perspective view of the trap main body 57 as seen from the side of the gas inlet tube 55. The flow adjustment plates 60, 60, etc. are omitted from FIG. 7 for the sake of easier comprehension.

As shown in FIGS. 7 through 9, slits 75 as gas circulation ports are formed in linear shapes extending from one end of the baffle plate 59 to the other in the longitudinal direction, and a plurality of these slits is formed at intervals in the width direction (circumferential direction) of the baffle plate 59.

Upon confirming through experiments, the optimum width of the slits 75 was found to be within a range of 3 to 7 mm. If the width exceeds 7 mm, the resulting flow causes reaction by-products and the like to adhere to the inner surfaces of the casing main body 52, and if the width is less than 3 mm, the slits 75 are clogged at early stages and the amount of reaction by-products adhering to the baffle plate 59 is reduced. Since the reaction by-products in the gas used for substrate processing have the property of adhering more readily to the reaction by-products already deposited on the baffle plate 59, the trapping efficiency of the baffle plate 59 is reduced when the amount of reaction by-products prior to clogging is small.

When slits 75 are formed in the baffle plate 59, gas used for substrate processing that has entered the casing main body 52 through the gas introduction port 55a flows toward the baffle plate 59, and reaction by-products and the like adhere readily to the baffle plate 59. Since the reaction by-products and the like in the gas used for substrate processing passing through the slits 75 are precipitated when in contact with the slits 75, the slits 75 gradually become closed off by the precipitated reaction by-products and the like. However, as previously described, when the slits 75 are closed off, the gas used for substrate processing flows downstream through the other flow channels 70, 72 along the baffle plate 59 and one partitioning wall 67, the reaction by-products and the like contained in the gas used for substrate processing cause the reaction by-products and the like to be precipitated on the partitioning wall 67 and the baffle plate 59, and the function of the exhaust trap 49 is therefore preserved. This is also applicable to improving the efficiency of trapping the reaction by-products and the like.

FIG. 10 is a simulation of a case in which a trap main body 57 is provided to the casing main body 52. As shown in FIG. 10, it is clear that the gas used for substrate processing flows at a high speed from the gas inlet tube 55 to the baffle plate 59 and does not stagnate, and the flow adjustment plates 60 reduce the speed of the gas used for substrate processing.

Therefore, as previously described, localized clogging caused by blocking on the exit side of the gas inlet tube 55 due to stagnation on the upstream side is prevented, and recovery is possible throughout the entire trap main body 57. In Embodiment 2, the gas flow slows down because the gas used for substrate processing that collides with the concave surface 59a of the baffle plate 59 enters through the slits 75 that serve as gas circulation ports. The high speed is then restored and the gas is discharged through the gas exhaust tube 56.

According to the embodiments, the following superior effects are exhibited.

(1) It is possible to prevent localized blocking that hinders the circulation of gas used for substrate processing, and the maintenance cycle of the exhaust trap can be made longer than in conventional practice.

(2) The productivity of the semiconductor device can be improved because the maintenance cycle is longer.

(3) Furthermore, there is no clogging resulting from precipitation of reaction by-products and the like in the gas inlet, because the cooling tubes are disposed near the baffle plate separated from the gas inlet, there is no stagnation in the vicinity of the gas inlet, and the gas inlet tube and casing main body are not cooled as in conventional practice.

The semiconductor device manufacturing apparatus of the present invention is not limited to the semiconductor device manufacturing apparatus in the embodiments described above, and can also be applied to a sheet-fed semiconductor device manufacturing apparatus. Instead of being applied to a gas used for substrate processing in which the reaction by-products are ammonium chloride, the semiconductor device manufacturing apparatus of the present invention can also be applied to a gas used for substrate processing that crystallizes or liquefies at low temperatures. A medium other than chilled water and other types of water can of course be used as the cooling medium. Furthermore, the slits 75 are examples of gas circulation ports formed in the baffle plate 59, but holes of any size may be formed instead of the slits 75. The slits 75 may also be formed at an incline in relation to the longitudinal direction of the baffle plate 59, and may also be formed in, e.g., zigzag fashion instead of linear fashion.

The number of flow adjustment plates 60, etc. is established based on the amount and flow rate of gas used for substrate processing as well as the amount of reaction by-products and the like contained therein, but depending on the process conditions, it is also possible to replace the trap main body 57 with one that does not have flow adjustment plates 60, etc. in cases in which the speed of the gas used for substrate processing is sufficiently slow in relation to the concave surface 59a of the baffle plate 59 and there is no need to use flow adjustment plates 60, etc. to reduce the speed. Also, the flow adjustment plates 60 slow down the gas used for substrate processing by providing resistance, but another possibility is to have a flat surface within the same plane and to have a line extending from the flat surface towards the concave surface 59a of the baffle plate 59.

The materials of the casing main body 52, the baffle plate 59, the cooling tube 58, and the flow adjustment plates 60 are preferably SUS304 and SUS316, which have good corrosion resistance, thermal conductivity, and heat resistance.

Thus, various modifications can be made to the present invention, and the present invention of course incorporates such modified inventions.

BRIEF DESCRIPTION OF THE DRAWINGS

FIG. 12 is a cross-sectional view of an exhaust trap according to a conventional semiconductor device manufacturing apparatus, and is also a diagram showing clogging caused by reaction by-products and the like;

KEY

Figure 1:
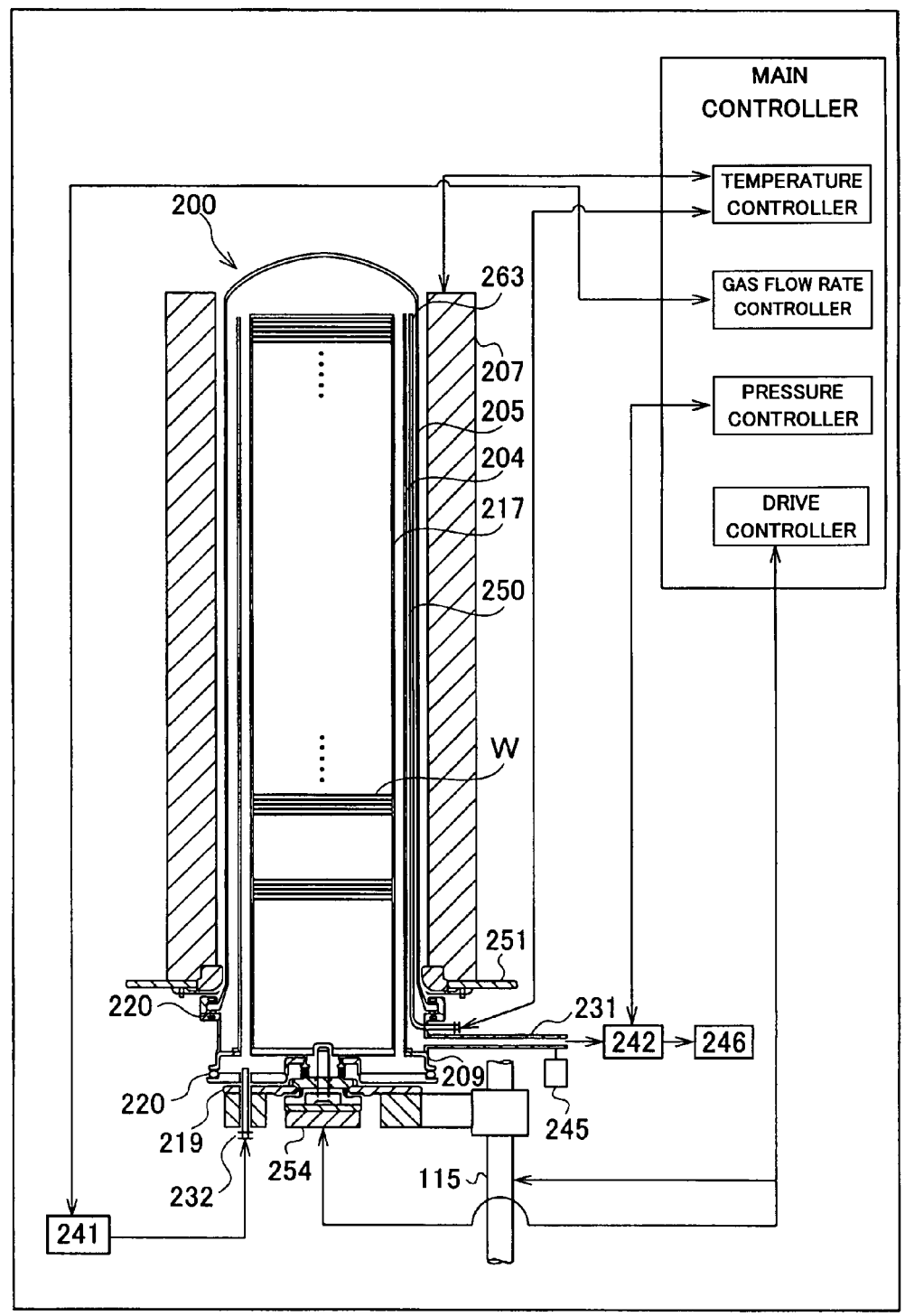
FIG. 1 is a longitudinal cross-sectional view of a low-pressure CVD reactor as a semiconductor device manufacturing apparatus according to the present invention.
Figure 2:
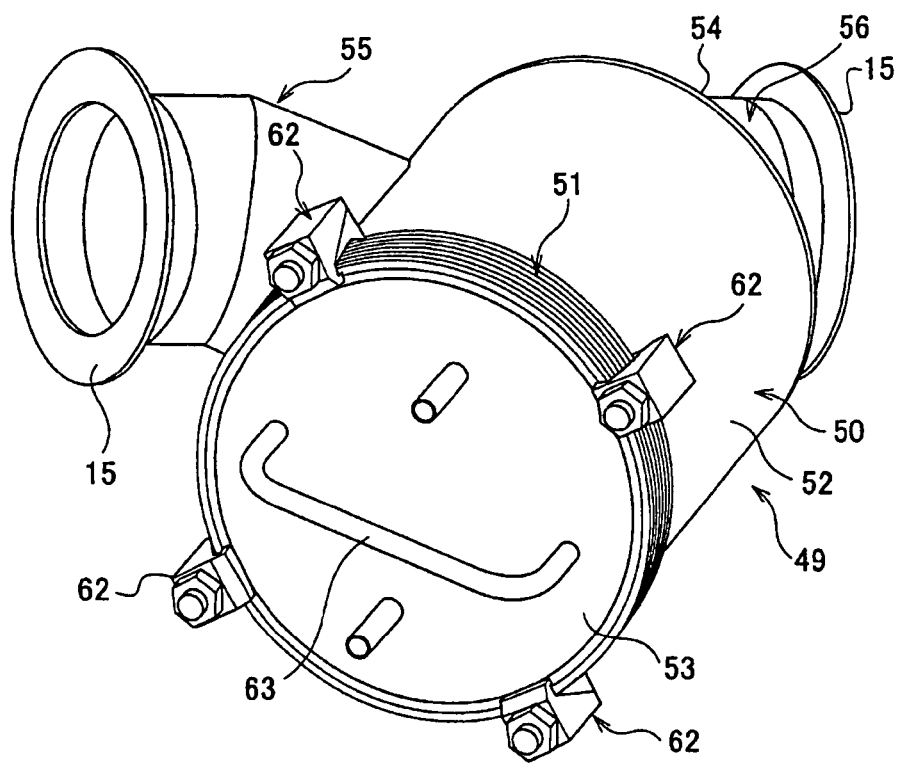
FIG. 2 is a perspective view showing an external view of the exhaust trap according to the semiconductor device manufacturing apparatus of the present invention.
Figure 3:
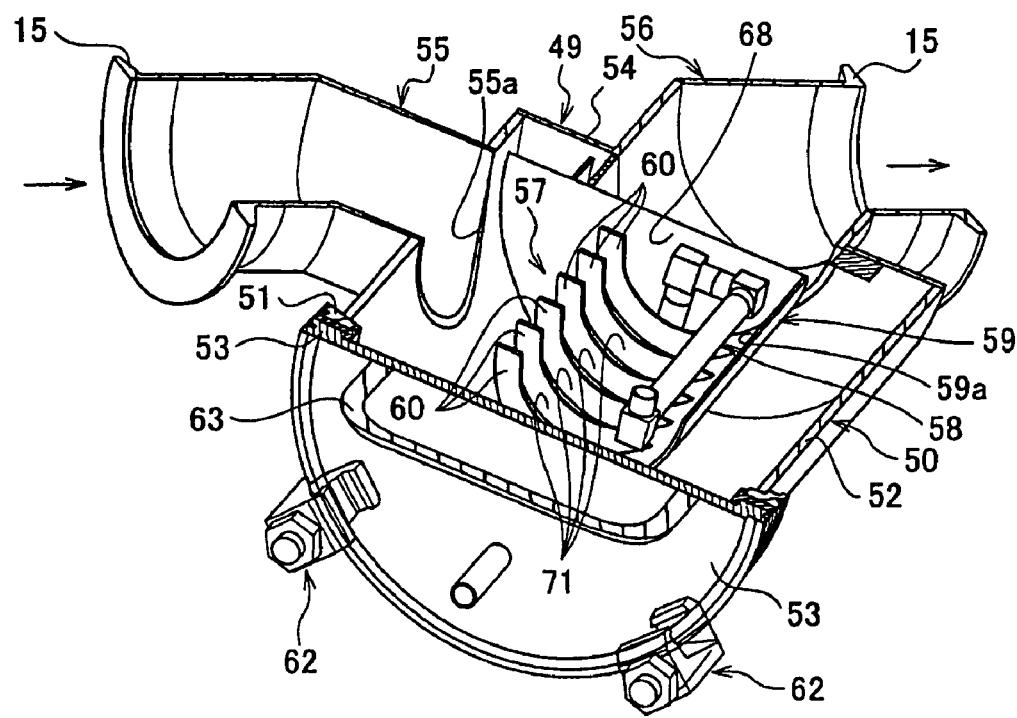
FIG. 3 is a cross-sectional perspective view along the axial direction of the exhaust trap according to the semiconductor device manufacturing apparatus of the present invention.
Figure 4:
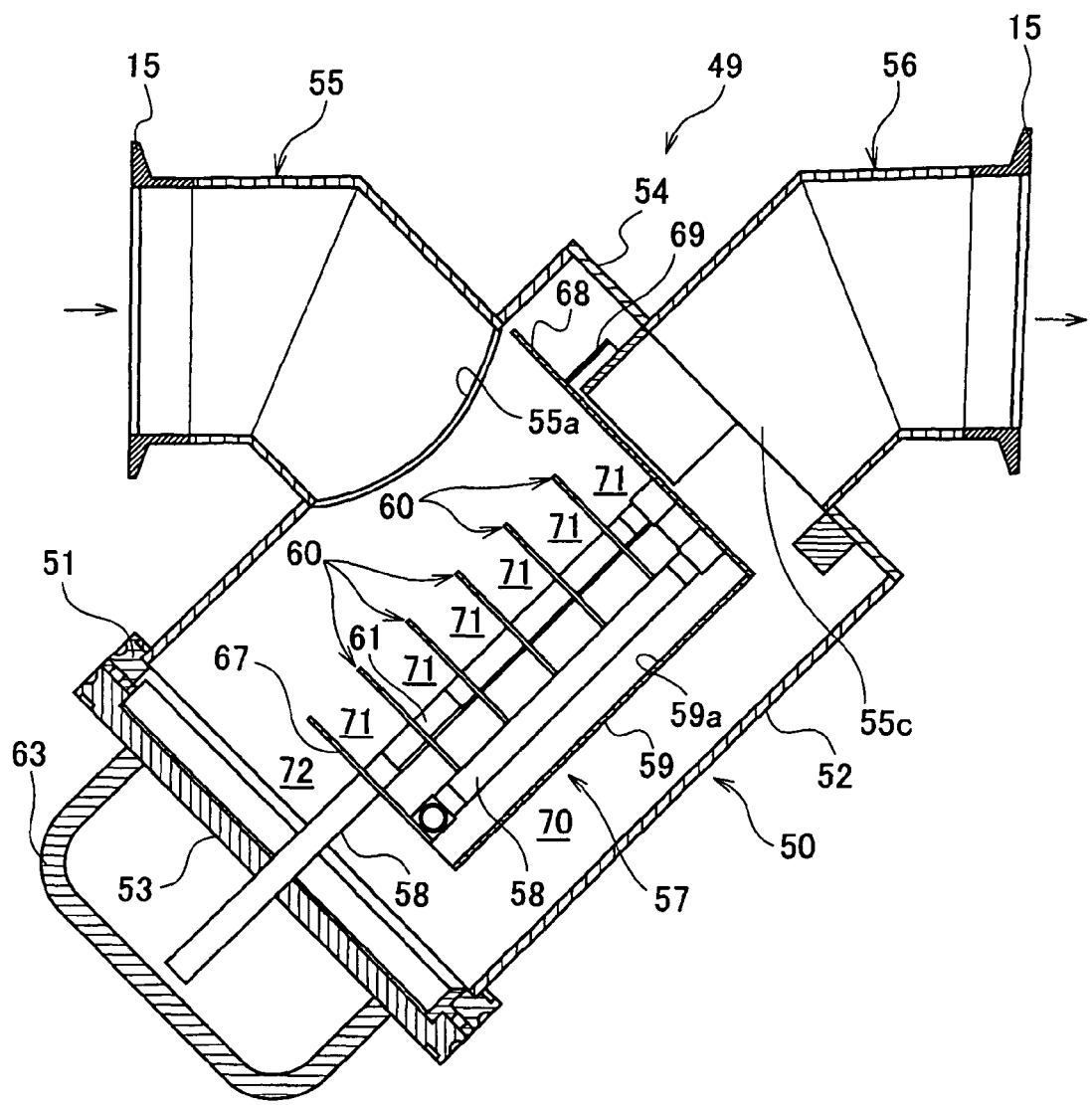
FIG. 4 is a cross-sectional view in the axial direction of the exhaust trap according to the semiconductor device manufacturing apparatus of the present invention.
Figure 5:
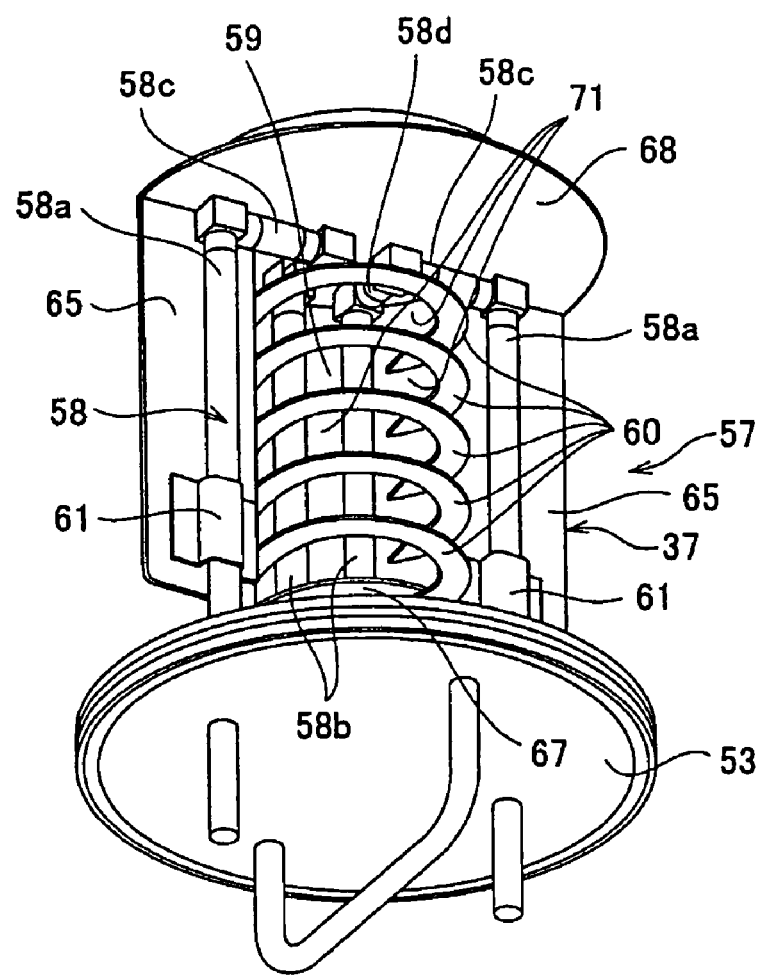
FIG. 5 is a perspective view showing the assembled state of the trap main body according to the semiconductor device manufacturing apparatus of the present invention.
Figure 6:
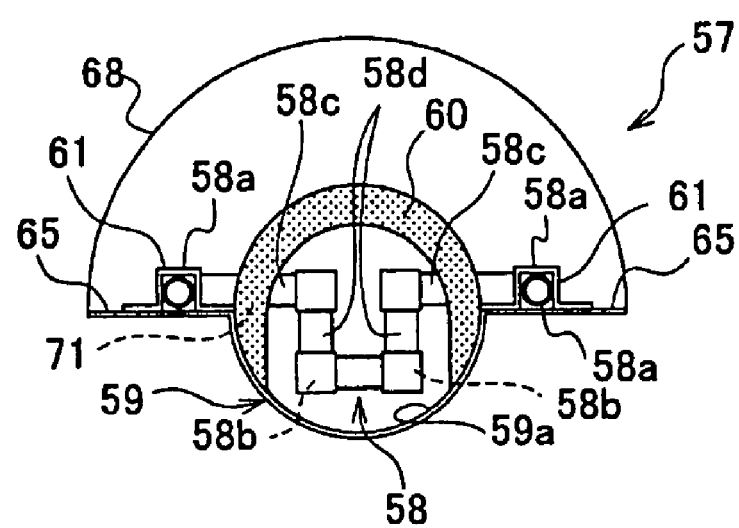
FIG. 6 is a cross-sectional view in the axial direction of the trap main body.
Figure 7:
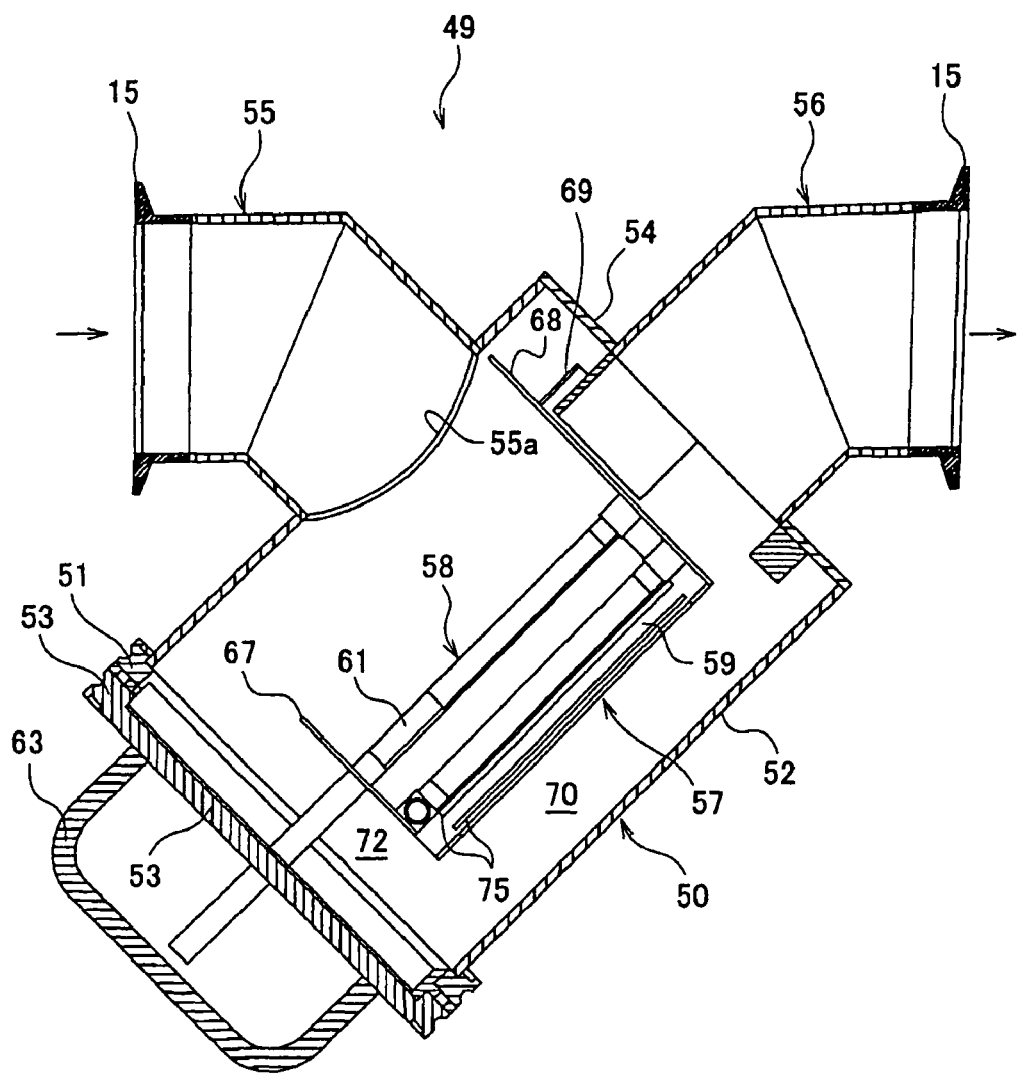
FIG. 7 is a cross-sectional view along the axial direction of the exhaust trap according to the semiconductor device manufacturing apparatus of the present invention.
Figure 8:
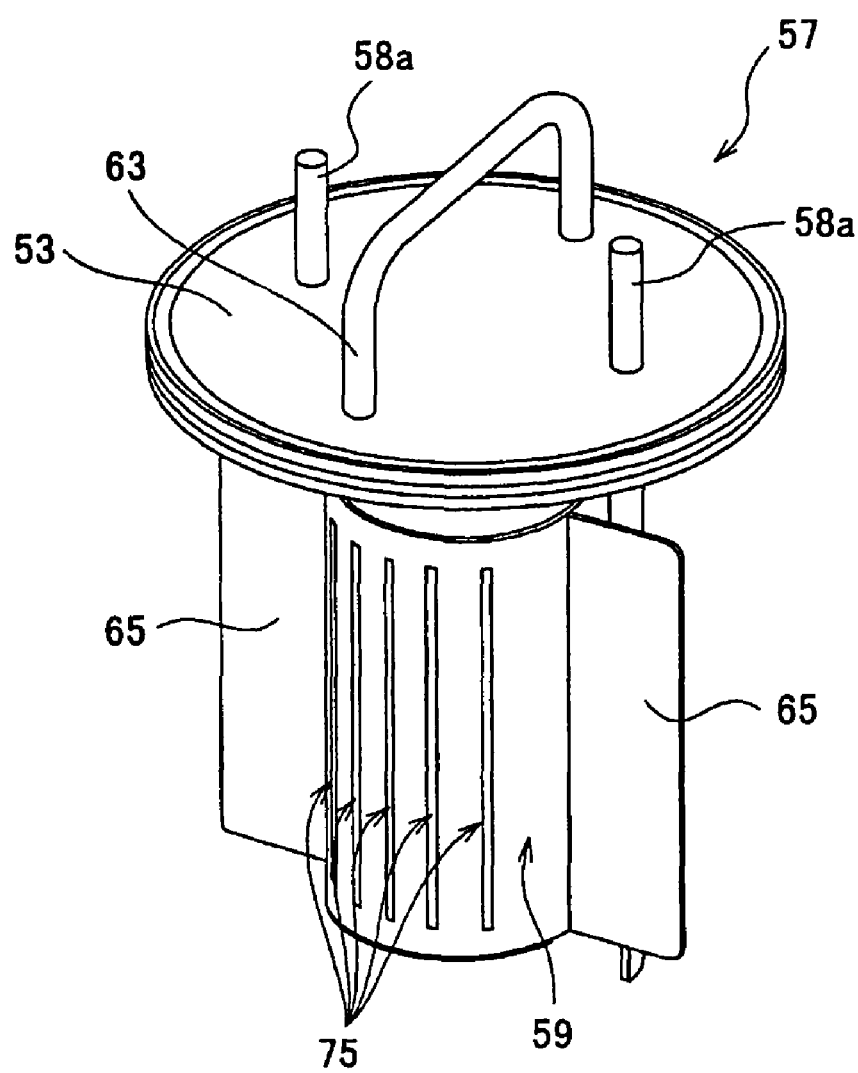
FIG. 8 is a perspective view of the trap main body according to the semiconductor device manufacturing apparatus of the present invention, as seen from the opposite side of the gas inlet tube.
Figure 9:
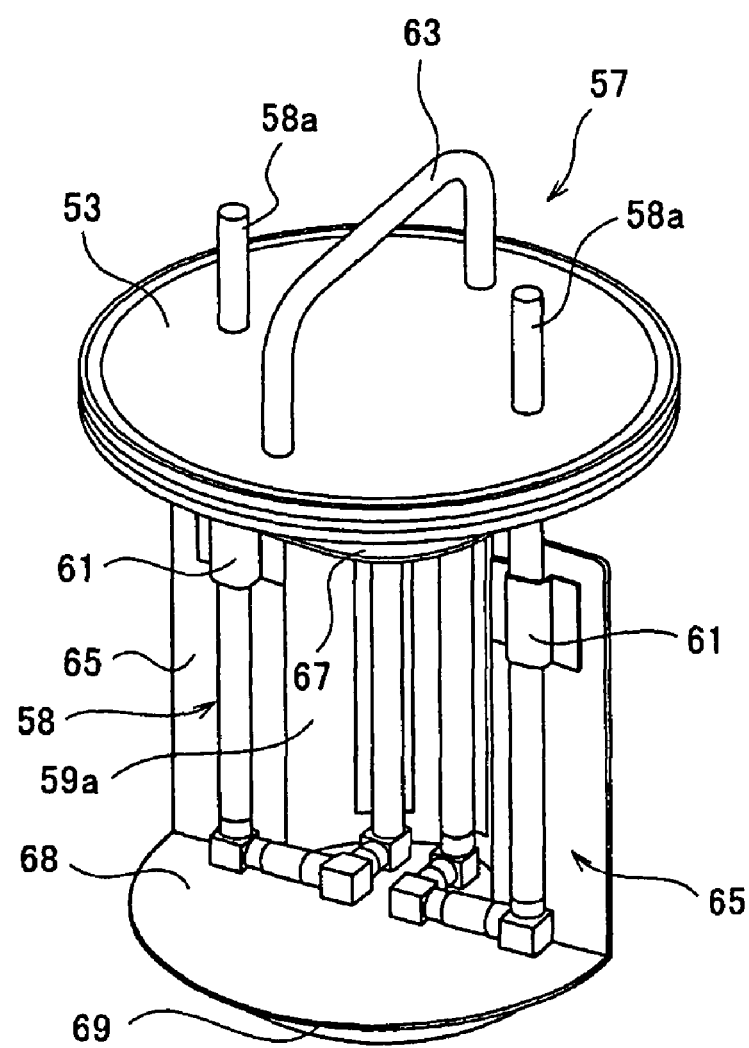
FIG. 9 is a perspective view of the trap main body according to the semiconductor device manufacturing apparatus of the present invention, as seen from the side with the gas inlet tube.
Figure 10:
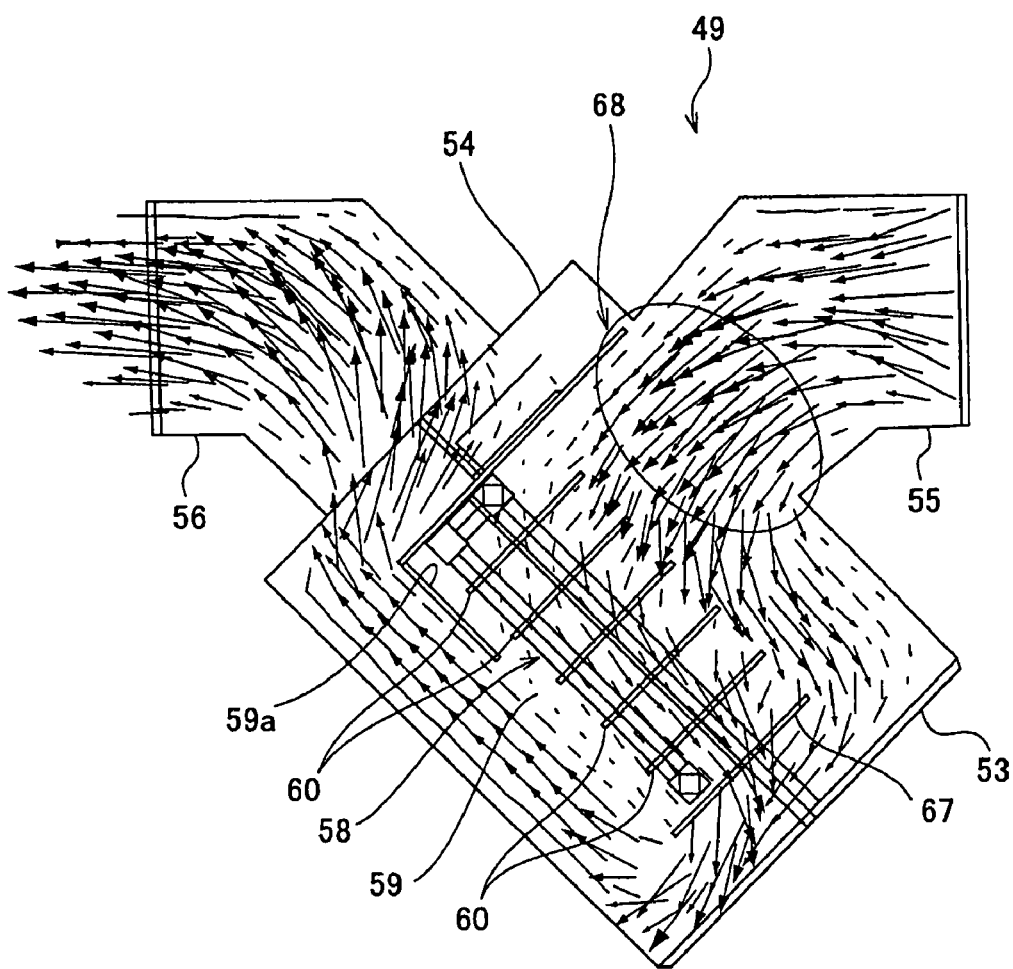
FIG. 10 is a diagram showing the results of a simulation of a gas flow in a state in which the trap main body is installed in the casing main body of the exhaust trap according to the semiconductor device manufacturing apparatus of the present invention.
Figure 11:
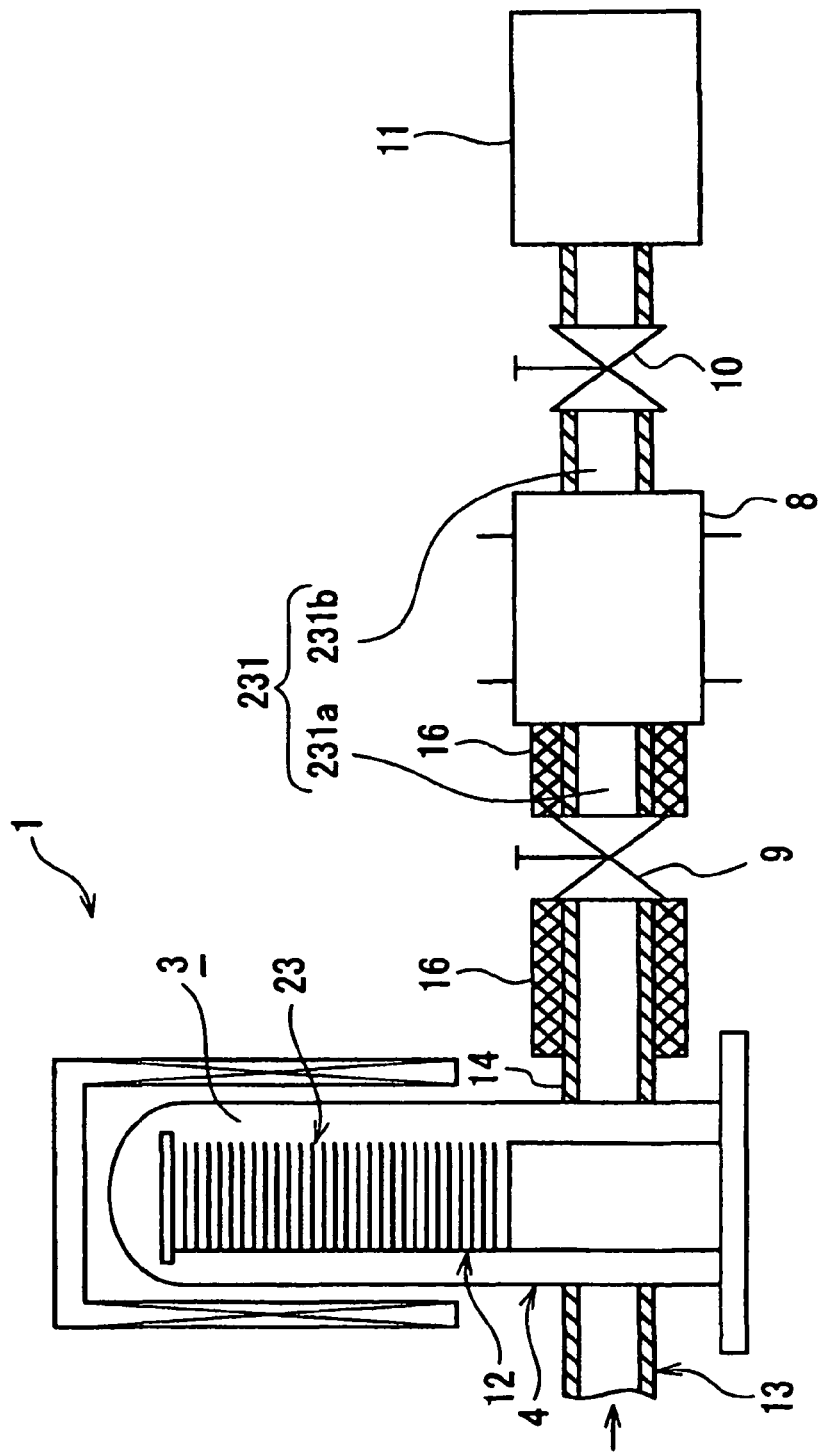
FIG. 11 is an explanatory diagram of a conventional semiconductor device manufacturing apparatus.
Figure 12:
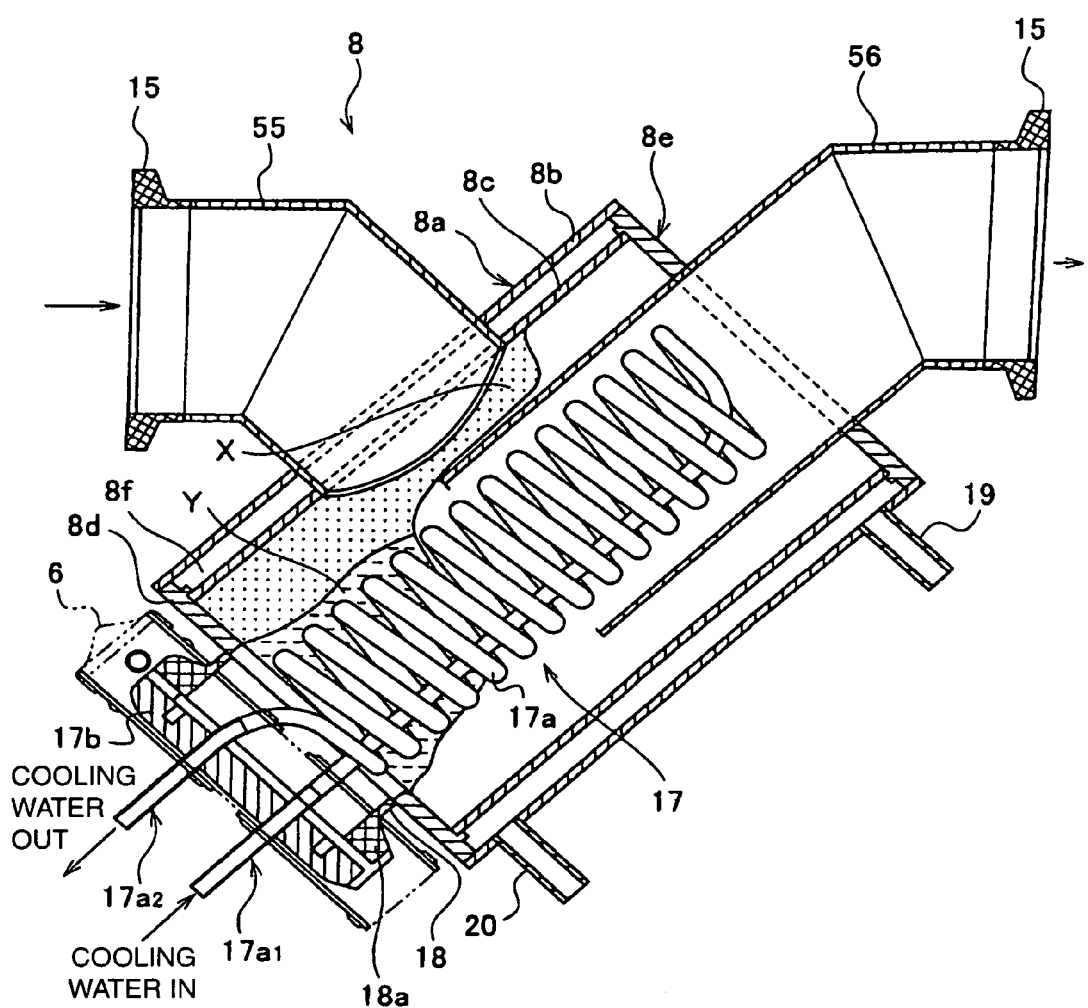
Figure 13:
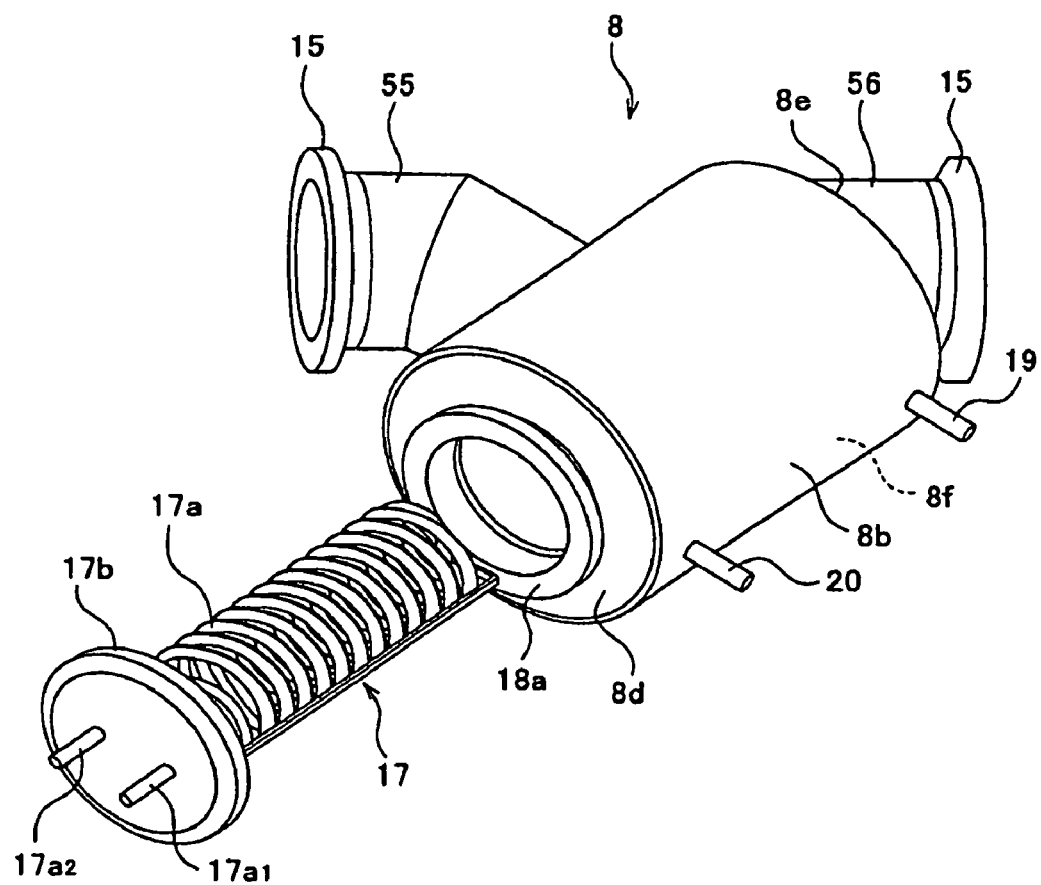
FIG. 13 is an explanatory diagram showing a state in which the trap main body is removed from the casing of a conventional exhaust trap.
Figure 14:
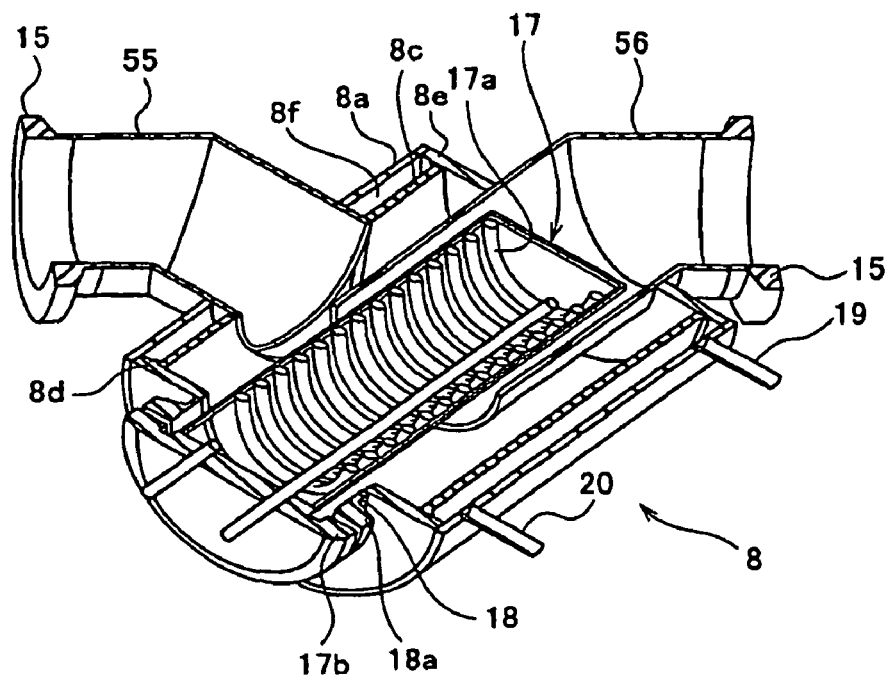
FIG. 14 is a cross-sectional view showing the structure of a trap main body of an exhaust trap according to a conventional semiconductor device manufacturing apparatus.
Figure 15:
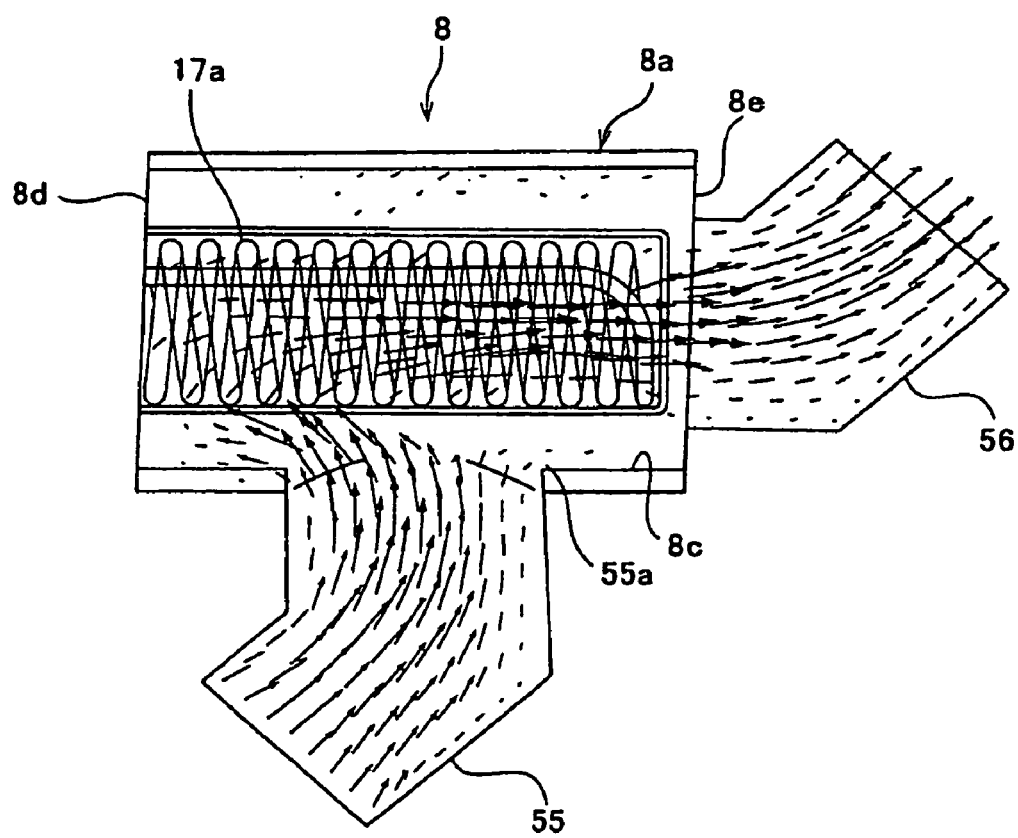
FIG. 15 is a diagram showing the results of a simulation of the flow of gas used for substrate processing in a conventional exhaust trap.

49 Exhaust trap
55a Gas introduction port
59a Concave surface
59 Baffle plate
231a Upstream exhaust tube (first exhaust tube)
231b Downstream exhaust tube (second exhaust tube)
232 Gas supply tube
250 Cylindrical space (substrate processing chamber)

The invention claimed is:

1. A semiconductor device manufacturing apparatus including:
   a substrate processing chamber;
   a gas supply tube for supplying substrate processing gas to said substrate processing chamber;
   a first exhaust tube for discharging gas used for substrate processing from said substrate processing chamber;
   an exhaust trap for removing components contained in the gas used for substrate processing introduced through said first exhaust tube; and
   a second exhaust tube for exhausting gas out of said exhaust trap after components have been removed from the gas used for substrate processing; wherein
   said exhaust trap comprising:
   a baffle plate that is substantially perpendicular to the direction in which gas is introduced into said exhaust trap and that has a concave surface in the side facing gas introduction port of the exhaust trap, and formed into an arcuate shape centered around the axis of a cooling tube;
   a plurality of flow adjusting plates formed into C-ring shapes, parts of which in the circumferential direction are recessed in the radial direction are provided in parallel to each other in a longitudinal direction of the baffle plate and provided substantially in parallel to the gas introduction direction, on the concave surface side of the baffle plate.

2. The semiconductor device manufacturing apparatus of claim 1, wherein a gas circulation port is provided on said baffle plate.

3. The semiconductor device manufacturing apparatus of claim 1, wherein
   said exhaust trap is formed from at least a casing main body and a trap main body whose primary component is said baffle plate; and
   said trap main body can be attached and removed from said casing main body.

4. The semiconductor device manufacturing apparatus of claim 3, wherein said casing main body is provided so as to have a higher temperature than said baffle plate.

5. The semiconductor device manufacturing apparatus of claim 1, wherein a partitioning wall is formed at one end surface of said baffle plate in the longitudinal direction so as to block the flow of said gas used for substrate processing into said second exhaust tube.

6. A manufacturing method of a semiconductor device using the semiconductor device manufacturing apparatus of claim 1,
   comprising:
   processing a substrate stored within said substrate processing chamber by exhausting said gas used for substrate processing out of said substrate processing chamber while supplying said substrate processing gas to said substrate processing chamber; and
   removing components contained in said gas used for substrate processing by introducing said gas used for substrate processing into the exhaust trap to pass through the exhaust trap, the components being removed by bringing said gas used for substrate processing into contact with the baffle plate.

7. A manufacturing method of a semiconductor device comprising:
   processing a substrate stored within a substrate processing chamber by exhausting gas used for substrate processing out of said substrate processing chamber through an exhaust tube while supplying substrate processing gas to said substrate processing chamber; and
   removing components contained in said gas used for the substrate processing by introducing said gas used for the substrate processing into an exhaust trap inserted into the exhaust tube to pass through this exhaust trap,
   wherein the exhaust trap comprises
   a baffle plate that is substantially perpendicular to the direction in which gas is introduced into the exhaust trap and that has a concave surface in a side facing the gas introduction port side of the exhaust trap, and formed into an arcuate shape centered around the axis of a cooling tube;
   a plurality of flow adjusting plates formed into C-ring shapes, parts of which in the circumferential direction are recessed in the radial direction are provided in parallel to each other in a longitudinal direction of the baffle plate and provided substantially in parallel to the gas introduction direction, on the concave surface side of the baffle plate, and
   the components are removed by bringing said gas used for substrate processing into contact with the baffle plate.

8. An exhaust trap apparatus used in a semiconductor device manufacturing apparatus, for removing components contained in a gas used for substrate processing, the gas used for substrate processing is exhausted through a first exhaust tube from a substrate processing chamber and introduced into the exhaust trap, and thereafter the exhaust trap apparatus exhausts the gas from which the components contained in this gas used for substrate processing are removed to a second exhaust tube, said exhaust trap apparatus comprising:

a baffle plate that is substantially perpendicular to a direction of a gas introduction to the exhaust trap and that has a concave surface in the side facing a gas introduction port of the exhaust trap, and formed into an arcuate shape centered around the axis of a cooling tube;

a plurality of flow adjusting plates formed into C-ring shapes, parts of which in the circumferential direction are recessed in the radial direction are provided in parallel to each other in a longitudinal direction of the baffle plate and provided substantially in parallel to the gas introduction direction, on the concave surface side of the baffle plate.

9. An exhaust trap apparatus used in the semiconductor device manufacturing apparatus of claim 8, wherein a gas circulation port is provided on said baffle plate.

10. An exhaust trap apparatus used in the semiconductor device manufacturing apparatus of claim 8, wherein a partitioning wall is formed at one end surface of said baffle plate in the longitudinal direction so as to block the flow of said gas used for substrate processing into said second exhaust tube.

* * * * *